United States Patent
Kaas et al.

(10) Patent No.: US 7,300,557 B2
(45) Date of Patent: Nov. 27, 2007

(54) DEVICE FOR TARGETED APPLICATION OF DEPOSITION MATERIAL TO A SUBSTRATE

(75) Inventors: Patrick Kaas, Eindhoven (NL); Volker Geyer, Niederkruchten (DE)

(73) Assignee: Scheuten Glasgroep, Venlo (NL)

( * ) Notice: Subject to any disclaimer, the term of this patent is extended or adjusted under 35 U.S.C. 154(b) by 499 days.

(21) Appl. No.: 10/508,196

(22) PCT Filed: Mar. 18, 2003

(86) PCT No.: PCT/EP03/02863

§ 371 (c)(1),
(2), (4) Date: Sep. 18, 2004

(87) PCT Pub. No.: WO03/078677

PCT Pub. Date: Sep. 25, 2003

(65) Prior Publication Data

US 2005/0145477 A1    Jul. 7, 2005

(30) Foreign Application Priority Data

Mar. 19, 2002 (EP) .................................. 02006164

(51) Int. Cl.
*C23C 14/00* (2006.01)

(52) U.S. Cl. ........................... 204/192.12; 204/298.18; 204/298.23; 204/298.25; 204/298.35

(58) Field of Classification Search ........... 204/192.12, 204/192.1, 298.01, 298.12, 298.15, 298.18, 204/298.21, 298.23, 298.11, 298.25, 298.35
See application file for complete search history.

(56) References Cited

U.S. PATENT DOCUMENTS

| | | | |
|---|---|---|---|
| 3,627,569 A | | 12/1971 | Beecham |
| 4,776,868 A | | 10/1988 | Trotter et al. |
| 5,344,352 A | * | 9/1994 | Horne et al. .................. 445/24 |
| 5,415,753 A | | 5/1995 | Hurwitt et al. |
| 5,518,594 A | * | 5/1996 | Marcquart et al. ..... 204/192.26 |
| 5,643,428 A | * | 7/1997 | Krivokapic et al. ... 204/298.11 |
| 5,885,425 A | * | 3/1999 | Hsieh et al. ........... 204/192.12 |
| 6,096,176 A | * | 8/2000 | Horiike et al. ......... 204/192.17 |
| 6,168,832 B1 | | 1/2001 | Boucher |
| 6,210,540 B1 | | 4/2001 | Hichwa |
| 6,365,010 B1 | * | 4/2002 | Hollars .................. 204/192.12 |
| 6,730,197 B2 | * | 5/2004 | Wang et al. ........... 204/298.11 |

* cited by examiner

*Primary Examiner*—Nam Nguyen
*Assistant Examiner*—Luan V. Van
(74) *Attorney, Agent, or Firm*—Richard Aron Osman (57) ABSTRACT

The invention relates to a device for the targeted application of deposition material onto a substrate, especially for focusing the sputter flux onto a narrow angular range in a PVD-system. The invention is characterized in that the deposition material is directed through a filter structure (90) having several channel-shaped individual structures (60) onto said substrate (30), whereby the streams of material are limited to a narrow angle range.

42 Claims, 10 Drawing Sheets

DEVICE FOR TARGETED APPLICATION OF DEPOSITION MATERIAL TO A SUBSTRATE

FIELD OF THE INVENTION

The invention relates to a device for the targeted application of deposition material onto a substrate, especially for focusing the sputter flux onto a narrow angular range in a PVD system. The invention also relates to a method for the targeted application of deposition material onto a substrate.

In industry, there is a need for devices capable of achieving a targeted coating of substrates by means of various coating techniques and methods. In particular, a number of applications call for special PVD (Physical Vapor Deposition) systems that are able to focus the material sputtered off by a target onto a narrow angular range and to apply it onto a substrate at different angles.

Normally, such cathode atomization or sputtering systems are configured in such a way that, within a very short period of time, a maximum amount of sputter material can be deposited. The distribution of the sputter material on the substrate should be as homogenous as possible here. In order to achieve this, apertures, for example, are used to geometrically limit the sputter flux. However, such apertures limit the sputter flux only in the outer areas, whereas the sputter jets are still highly scattered.

German Preliminary Published Application No. 198 19 785 describes a sputtering cathode based on the magnetron principle with which a magnetic field is applied transversely to the direction of movement of the charge carrier in order to increase the sputter rate.

German Preliminary Published Application No. 195 06 799 describes a sputtering device that produces thin layers with which a control electrode means having an adequately large geometric permeability is placed into the space between the plasma and the substrate in order to control the sputter particles. The movement of the sputtered and positively charged target particles can be influenced by this control electrode means.

European patent application EP 0 509 305 describes a method for depositing track conductors into indentations at a large aspect ratio. The aspect ratio is defined by the ratio of the depth to the width of the indentation. A method of reactive sputtering employing a collimator is used for the deposition, whereby the collimator has an aspect ratio that is similar to the indentation at whose bottom the track conductor is to be deposited.

U.S. Pat. No. 4,776,868 discloses a method for the production of convex elevations on a substrate, whereby the elevations are processed into lenses. The elevations are applied in that, in a vacuum, a vapor of a substance from a source is deposited and passed through a mask with openings before the vapor strikes the substrate. The thickness of the mask is selected in such a way that a vapor cone enters an opening in a converging pattern and exits again in a diverging pattern, subsequently striking the substrate.

U.S. Pat. No. 3,627,569 discloses a method and a device for vapor deposition of thin films with which the thickness profile and the surface area to be coated are greatly controlled by an orienting device. The orienting device consists of several elongated channels that serve to channel the vapor between the source and a substrate. This brings about a uniform distribution and an orientation of the vapor flux.

U.S. Pat. No. 5,415,753 describes an aperture plate positioned between a sputter target and a substrate to be coated with the target material. The aperture plate is essentially configured in such a way that, due to its small aspect ratio, it does not have an orienting effect. The openings of the aperture plate capture a certain percentage of sputter particles while other sputter particles are allowed to pass through the openings for deposition onto the substrate. The device causes the deposition rate of the aperture plate to be less than the deposition rate of the sputtering process.

U.S. Pat. No. 6,168,832 discloses a method for vacuum deposition of one or more layers onto a substrate, whereby the thickness distribution of the layers is controlled by a three-dimensional mask positioned between the substrate and a vapor source. In a described embodiment, the substrate as well as the mask rotate, whereby the mask is circular and has slits arranged in a fan-like pattern.

U.S. Pat. No. 6,210,540 describes a mask that is placed over the center portion of a deposition source in order to limit the angle of flux from the source. A device on whose circumference a substrate to be coated has been positioned rotates in front of the mask. The mask shields the area of the device that is not to be exposed to the deposition. The rotation of the device brings about a coating of the side surfaces of the substrate at changing angles.

European patent application EP 0 717 432 discloses a device for sputtering a material onto a substrate with which there is a tube positioned between the sputter target and the substrate that is to be coated. The tube prevents selected areas of the target material flux from reaching the substrate.

Japanese patent application JP 07 113 172 describes a collimator that is located in a device for applying a thin film, whereby the collimator has numerous uniformly arranged slits. The material passes through the slits in order to form the film.

Japanese patent application JP 10 121 234 likewise describes a sputtering device with a collimator that is supposed to eliminate or reduce asymmetry in film formation.

Furthermore, Japanese patent application JP 1 260 139 proposes a collimator with several openings that is positioned between a sputter target and a wafer. The inner surfaces of the openings are configured with a sawtooth pattern and with sharply tapered sections (crown-shaped grooves).

SUMMARY OF THE INVENTION

The objective of the invention is to configure a device of the generic type in such a way that it allows the application of deposition material onto a substrate in a targeted manner and limited to a narrow angular range, whereby the application is carried out at an angle different from 90° relative to the surface of the substrate. Moreover, the objective of the invention is to create a method for the targeted application of deposition material at an angle different from 90° onto a substrate.

According to the invention, this objective is achieved in that a device of the generic type is equipped with a filter such that the deposition material that is to be applied is focused onto a narrow angular range. Here, channel-like individual structures of the filter run at an angle different from 90° relative to the surface of the substrate. Moreover, the deposition source is conflaured in such a way that it deposits material jets at the same angle relative to the surface of the substrate.

In particular, the objective is achieved in that a sputtering device is equipped with a filter that is positioned between the sputter target and the substrate in such a way that the sputter particle flux is passed through it and focused.

The filter according to the invention consists of several channel-like individual structures. The sputter particle flux is focused as a function of the geometric dimensions of the individual filter structures, whereby the design of the filter is based on considerations pertaining to the geometry of jets. During the sputtering procedure, a sputter groove in the form of an oval indentation is created, from which the target particles are sputtered out. Now, if a sputter particle flux that is scattered in many directions stemming from a point source of such a sputter track enters an individual structure of the filter according to the invention, then only the sputter particles that entered at a certain angular range β are allowed to pass through. This maximum angle of aperture β=2×α results from the relationship tan α=W/L, whereby W is the width and L is the length of the filter individual structure. Sputter particles that entered the structure outside of this angular range are deposited on the inner walls of the structure and thus eliminated. In this manner, the exiting sputter flux is limited to a narrow angular range that can be set through the dimensions of the filter structure.

The filter consists of several individual structures that are preferably arranged next to each other in such a way that the main portion of the sputter flux stemming from the sputter track of the target can be passed through the filter structures and focused.

The individual structures of the filter can be shaped in different ways. Moreover, the filter according to the invention can be used not only for sputtering processes but also for other coating processes in which deposition material is to be focused in a targeted manner and onto a narrow angular range.

Additional advantages, special features and advantageous refinements of the invention ensue from the subordinate claims and from the presentation below of preferred embodiments with reference to the figures.

DETAILED DESCRIPTION OF EMBODIMENTS OF THE INVENTION

Figure 1:
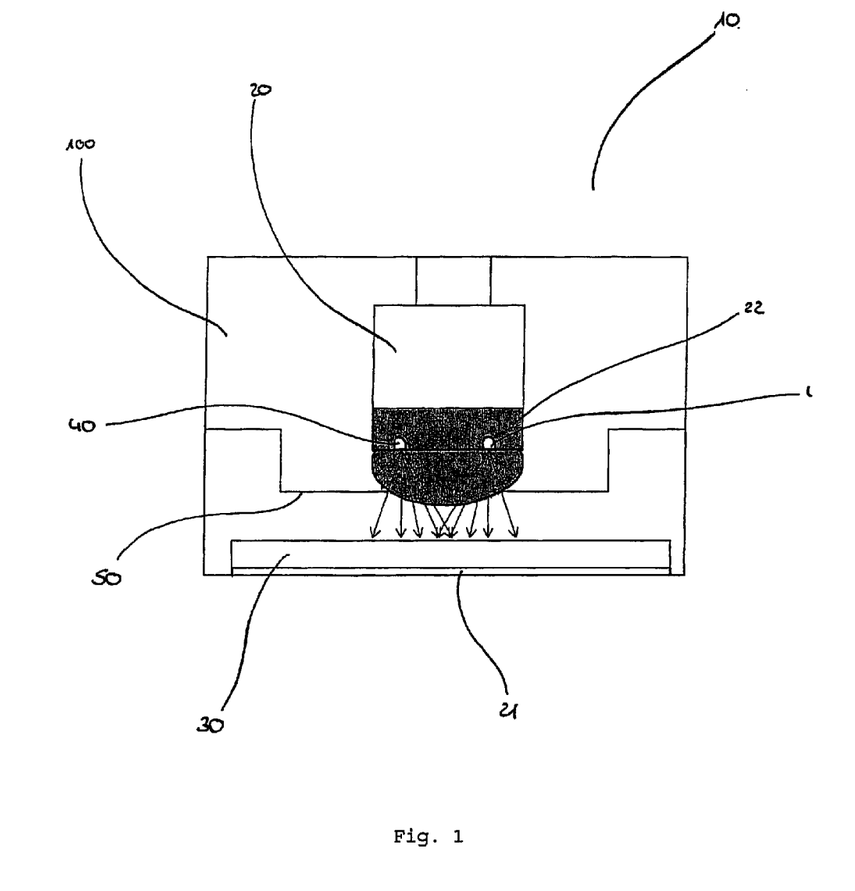
FIG. 1 the known state of the art for apertures in PVD systems.

The drawing in FIG. 1 is a simplified depiction of the state of the art for cathode sputtering (PVD) systems. The system 10 comprises a cathode 20, an anode 21 and a plasma that was ignited between the two electrodes. A voltage drop occurs in front of the cathode and this accelerates the positively charged particles of the plasma so that these particles strike a sputter target 22 that is located in front of the cathode. There, the particles of the plasma eject individual atoms or molecules which then scatter in all directions and strike the substrate 30, where they form a layer whose composition corresponds to the target composition.

During the sputtering process, a sputter track or so-called "racetrack" in the form of an indentation with an oval shape is formed on the target 22 since the particles are not sputtered off by the entire target surface but rather only in the area of this oval structure. The drawing shows two point sources 40 of such a sputter track on the target, particles being sputtered off from these point sources 40 in all directions.

Such sputtering cathodes and systems are preferably configured in such a way that, within a very short period of time, a maximum amount of sputter material is deposited. In order for the coating of the substrate 30 to be as homogenous as possible, the sputter flux is guided through the opening of an aperture 50 and onto the substrate 30. However, the drawing shows that no focused and targeted sputter flux is possible through an aperture since the sputter flux is still highly scattered and only the scattering in the outer areas is prevented.

Therefore, the invention calls for equipping a device for the application of deposition material with a filter that focuses the deposition material onto a narrow angular range. These devices can be any kind of systems with which deposition material is applied in the form of particles onto a substrate. For example, these can be PVD (Physical Vapor Deposition), spraying and/or CVD (Chemical Vapor Deposition) systems.

Therefore, in particular, the invention calls for equipping a cathode atomization or sputtering system with a filter that limits the sputter flux to a narrow angular range. The filter is placed between at least one sputtering cathode with a sputter target and the substrate that is to be coated, so that the flux of the sputtered off particles is passed through the filter structure.

Figure 2:
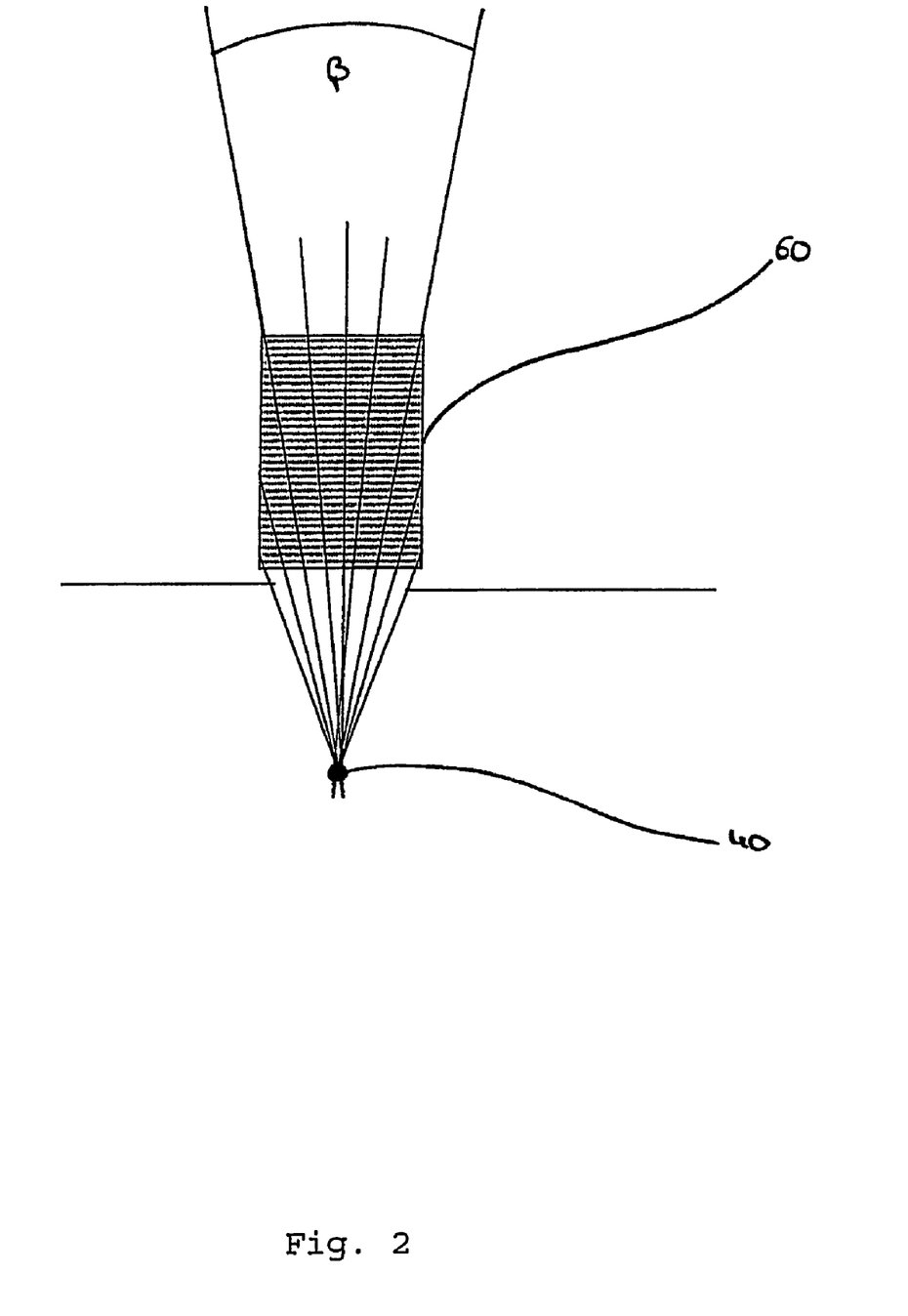
FIG. 2 the influence of an individual structure of a filter on the sputter flux direction of a point source.

The design of the filter is based on considerations pertaining to the geometry of jets, whereby the geometric dimensions are selected in such a way that scattered sputter directions are eliminated outside of a certain angular range, thus limiting the sputter jet to the appertaining angular range. The drawing in FIG. 2 shows the effect of an individual structure of such a filter on a point source. If the individual structure 60 is placed into the sputter jets stemming from a point source 40 of a target, it filters out the jets scattering towards the outside so that the sputter jets that exit from the filter structure are limited to a certain angular range β. Sputter jets outside of this angular range are deposited onto the inner walls of the structure and are thus eliminated.

Figure 3:
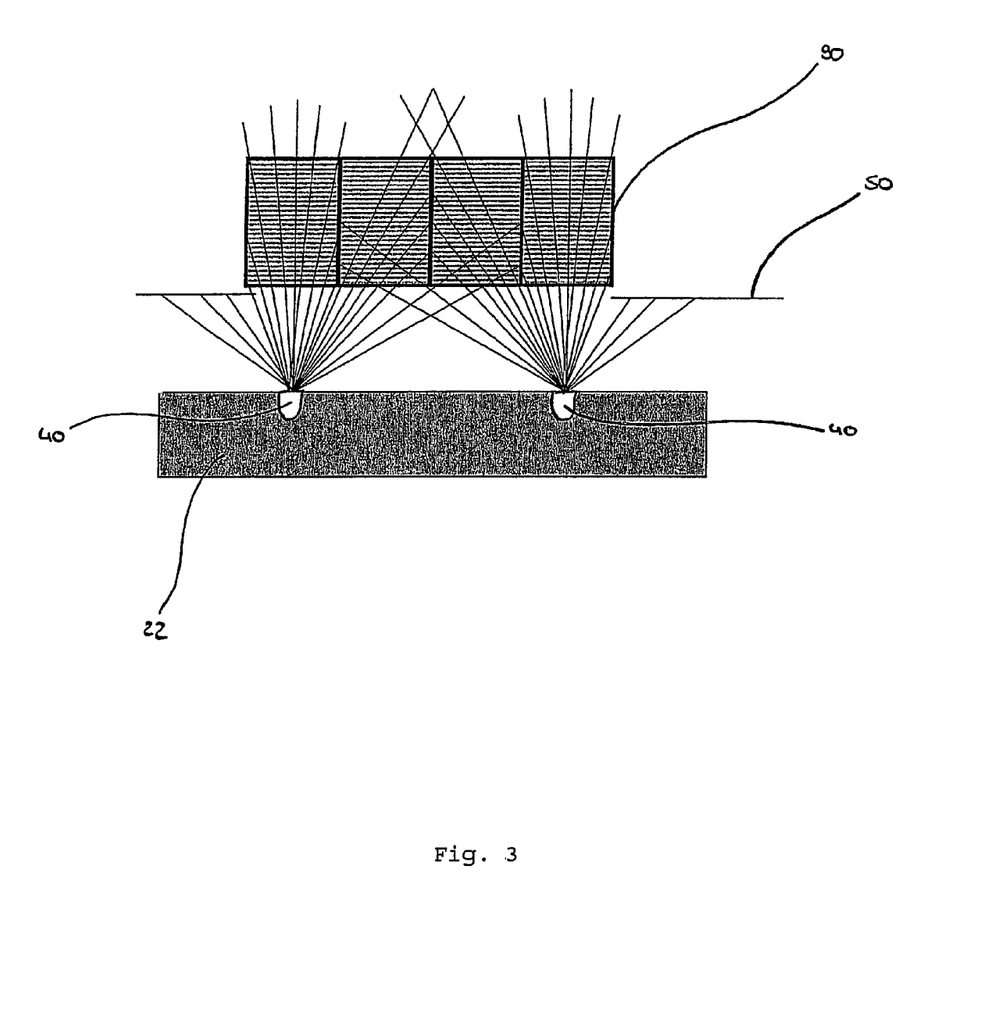
FIG. 3 the effect of a multiple structure of a filter on the sputter flux direction of a sputtering cathode.

FIG. 3 shows the effect of a multiple structure of a filter according to the invention on the sputter flux directions of a target 22. Here, the filter is made up of several individual structures arranged next to each other, and this multiple structure 90 of such a filter is located in the sputter jets of several point sources 40 of a target 22. The point sources shown in the drawing are point sources in the sputter track of the target 22. The multiple structure of the filter 90 filters out the undesired sputter directions, thus limiting the angular range of all of the sputtered off particle jets that pass through the multiple structure. Downstream from the filter, a targeted sputter flux is formed that makes it possible to apply the deposition material in a targeted manner at an angle onto the substrate.

Figure 4:
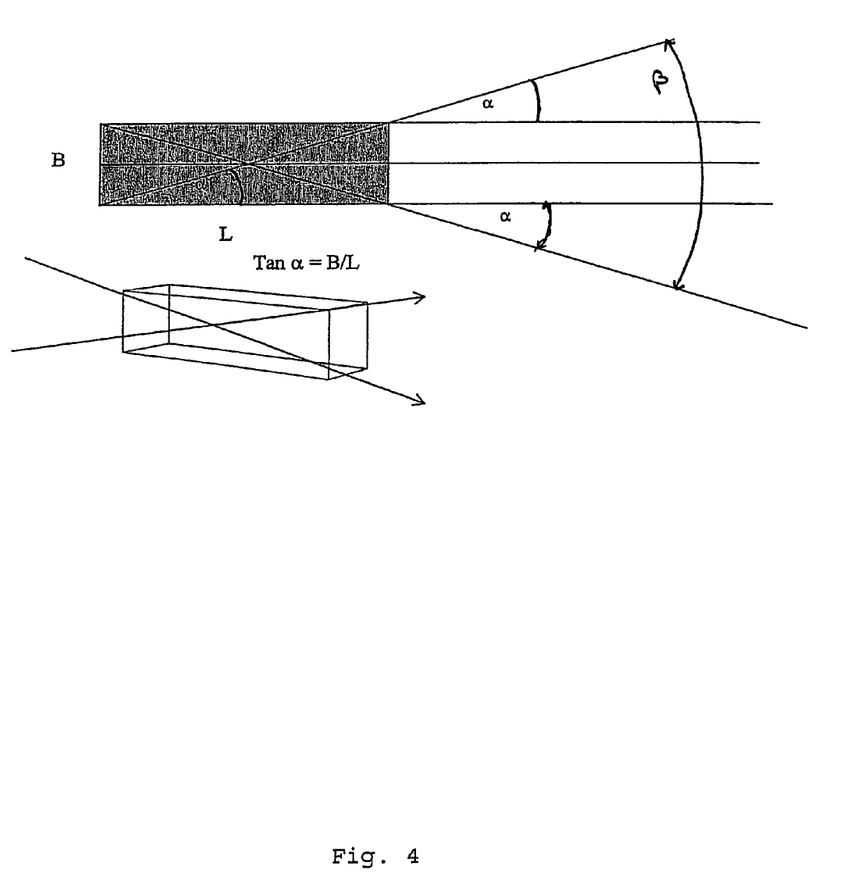
FIG. 4 the maximum angle of aperture of the filtered sputter flux.

The drawing in FIG. 4 shows the geometric relationships of the individual structures of a filter. These are preferably channel-like structures. The maximum angle of aperture of the filtered sputter flux depends on the geometry of the individual structure, whereby in the embodiment depicted, a channel structure with a rectangular cross section was selected. The maximum angle of aperture β=2 ×α is determined here by the ratio of the aperture width W to the structure length L, since $\alpha$ can be calculated with the formula $\tan \alpha = W/L$. The angle of aperture $\beta$ typically lies in the order of magnitude of 10° to 120°.

The length L is determined by the length of the channel of the structure, whereas the width W is determined by the widest cross section of the structure. The width W preferably lies in the order of magnitude of 2 mm to 25 mm, whereas the length L, depending on the desired angle of aperture, can be calculated according to the relationships $\tan \alpha = W/L$ and $\beta = 2 \times \alpha$.

Figures 5, 6, 7, 8:
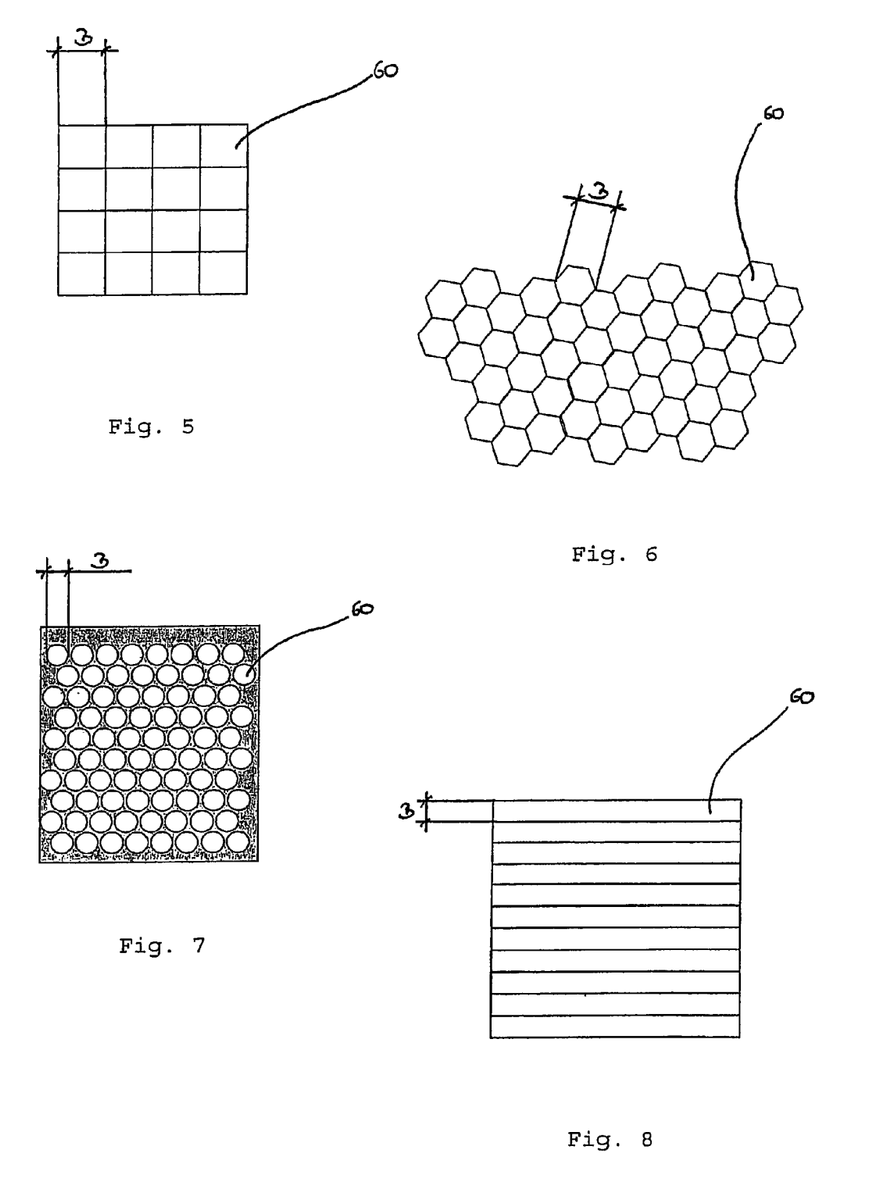
FIGS. 5, 6, 7, 8 various configurations of filter structures.

The shape of the structures can be selected as a function of the purpose and is thus not limited to a rectangular cross section, as is shown in FIG. 8. FIGS. 5, 6 and 7 show embodiments of filter structures with different cross sections. These can be, for example, structures with square, honeycomb or round cross sections. If it is felt to be advantageous, it is also an option to have different cross sections within a multiple structure.

If a channel with a round cross section is selected, then the diameter of the channel should advantageously be taken as the width W. If a honeycomb cross section is selected, then the widest cross section of the structure should be taken as the width W. The number of individual structures within a filter depends on the application and on the angular range to be achieved. Typical numbers, for example, for square channels within a structure, lie in the order of magnitude of $1600/m^2$ to $250,000/m^2$.

The filter structures can be made with a wide variety of materials that fulfill the specific requirements made of them. These include stability, chemical and physical resistance as well as ease of cleaning. Such materials include, for example, suitable plastics, aluminum alloys, iron or steel alloys, which make up at least 80% of the filter. The thickness of the web material is preferably selected in such a way as to ensure the stability of the structure but so that no excessive shading occurs. Typical web thicknesses lie in the order of magnitude of 0.05 mm to 2 mm.

Moreover, it has proven to be advantageous to use structures for the filters that allow easy cleaning. This is possible, for instance, with the lamellar structures in FIG. 8 in which the rectangular cross section of the individual structures is configured so as to be very long and only a few crosspieces stiffen the structure. As a result, the inner walls of these structures can easily be cleaned by moving a cleaning implement such as a brush lengthwise through the cross section. If the application only requires the particle jets to be focused in the crosswise direction relative to the individual structures, then such structures with lamellar cross sections are sufficient and can be cleaned with very little effort.

As a matter of principle, the structures should not have any areas that are difficult to clean. If mechanical cleaning is not possible, for example, with brushes or sandblasting, then etching methods, for example, can be used for cleaning purposes. Other cleaning processes are likewise possible. The type of cleaning is advantageously selected as a function of the type of filter material, the shape of the filter and of the target material used. If the filter is not intended to be cleaned, it should advantageously be made of a material that, together with the deposited sputter material, can be disposed of easily and inexpensively.

Figure 9:
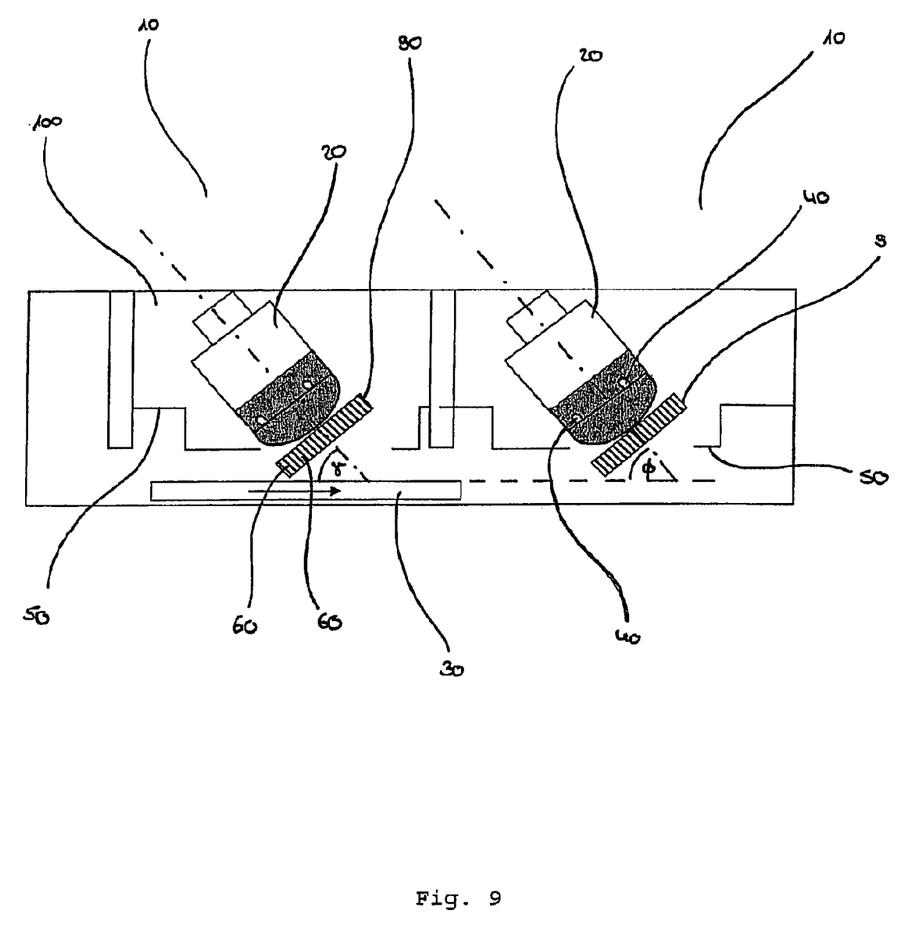
FIGS. 9, 10 embodiments of inline processes with a slanted cathode.

In order to achieve a certain application direction during the sputtering process, an especially preferred embodiment of the invention proposes that the sputtering cathode with the sputter target and the filter structure located behind it in the sputtering direction be positioned at an angle relative to the substrate. Such a set-up is shown in FIG. 9. This is an inline process in which a substrate 30 is passed consecutively through at least two PVD systems 10. The cathodes 20 with the individual sputter targets 22 as well as the filter structures 90 are at an angle $\gamma$ relative to the surface of the substrate. The filters each focus the sputter flux of the cathode onto a certain area so as to achieve a targeted sputter flux. The resulting targeted deposition of sputter material onto the substrate is carried out at the set angle $\gamma$ that is determined by the orientation of the cathode and the filter structure. By changing the orientation, one also changes the application angle.

The substrate is moved past the cathode with the filter at a certain distance with a speed in the order of magnitude of 0.1 nm/min to 12 m/min, so that the substrate is coated with deposition material in accordance with the requirements. The deposition or sputter rates achieved in this manner depend to a great extent on the marginal conditions such as, for example, the sputter power, the sputter pressure and the target material. Moreover, the sputter rate depends on whether the sputter set-up is reactive and whether the target is ceramic or metallic. Typical deposition rates in such a device lie in the order of magnitude of 0.1 nm/min to 1000 nm/min.

In an especially preferred embodiment of the invention, the angles set in the PVD systems 10 differ so that differently targeted sputtering processes can be carried out in the individual stations. In the first station, the substrate is coated at the angle $\gamma$, whereas the deposition in the second station is carried out at an angle $\phi$. This can be necessary, for instance, during the production of self-adjusting series circuits of thin layers, in which a substrate is exposed layerwise to material deposition at differing angles of incidence.

Figure 10:
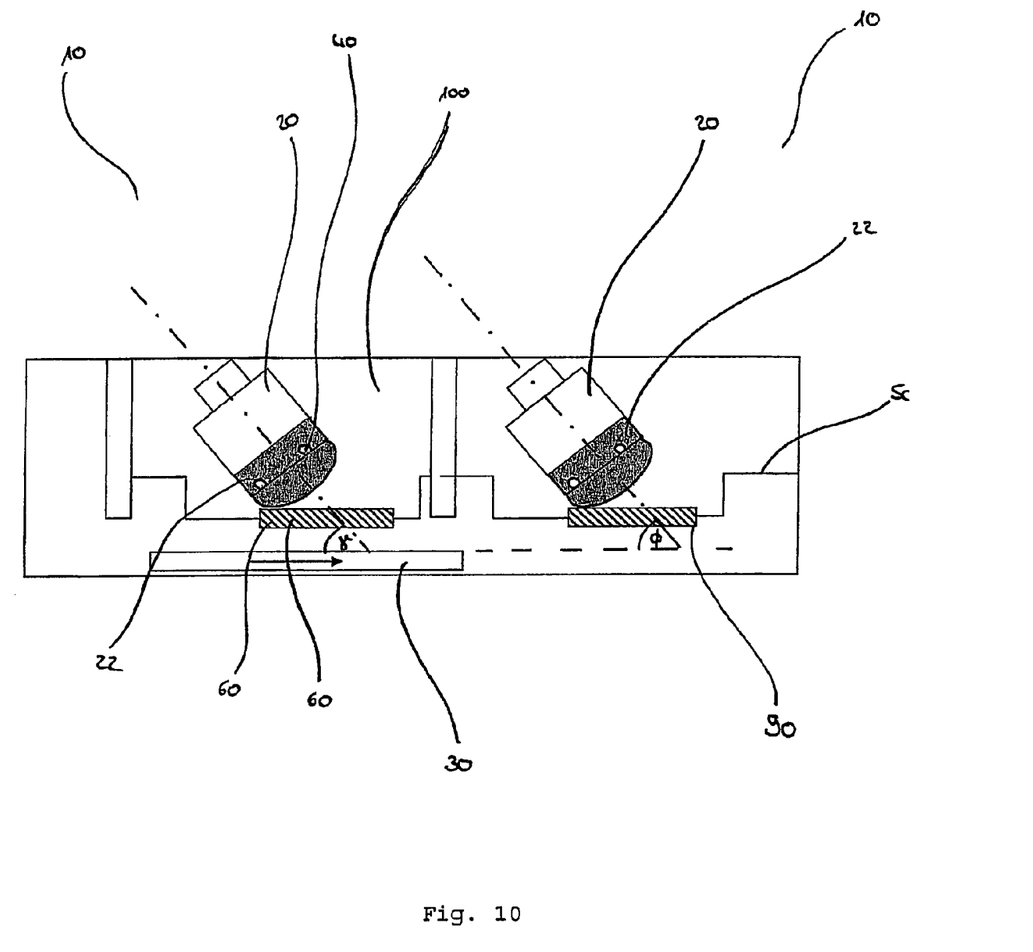

FIG. 10 shows another inline process in which the individual cathodes 20 and sputter targets 22 are positioned at an angle $\gamma$ relative to the passing substrate 30, whereas the filter structures 90 are installed in such a way that they preferably run parallel to the surface of the substrate. Naturally, the filter here can also be arranged at any desired angle relative to the surface of the substrate. The individual structures 60 of the filter are configured in such a way that the channels, in turn, are positioned at the angle $\gamma$ relative to the substrate 30. Thus, a targeted oriented application of sputter material at a certain angle is likewise achieved. The specific angle can be changed by aligning the cathode 20 and by changing the individual structures 60 of the filter 90.

Figure 11:
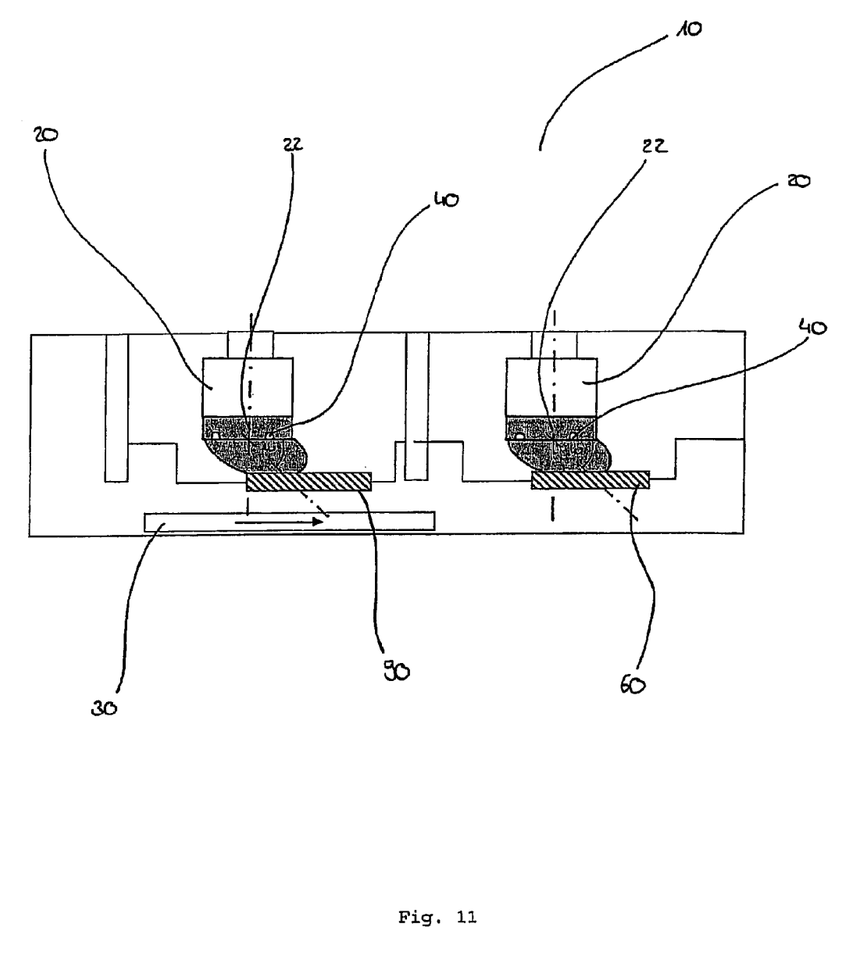
FIGS. 11, 12 embodiments with a horizontal cathode and slanted sputtering plasma and FIG. 13 an embodiment with a rotating cathode.
Figure 12:
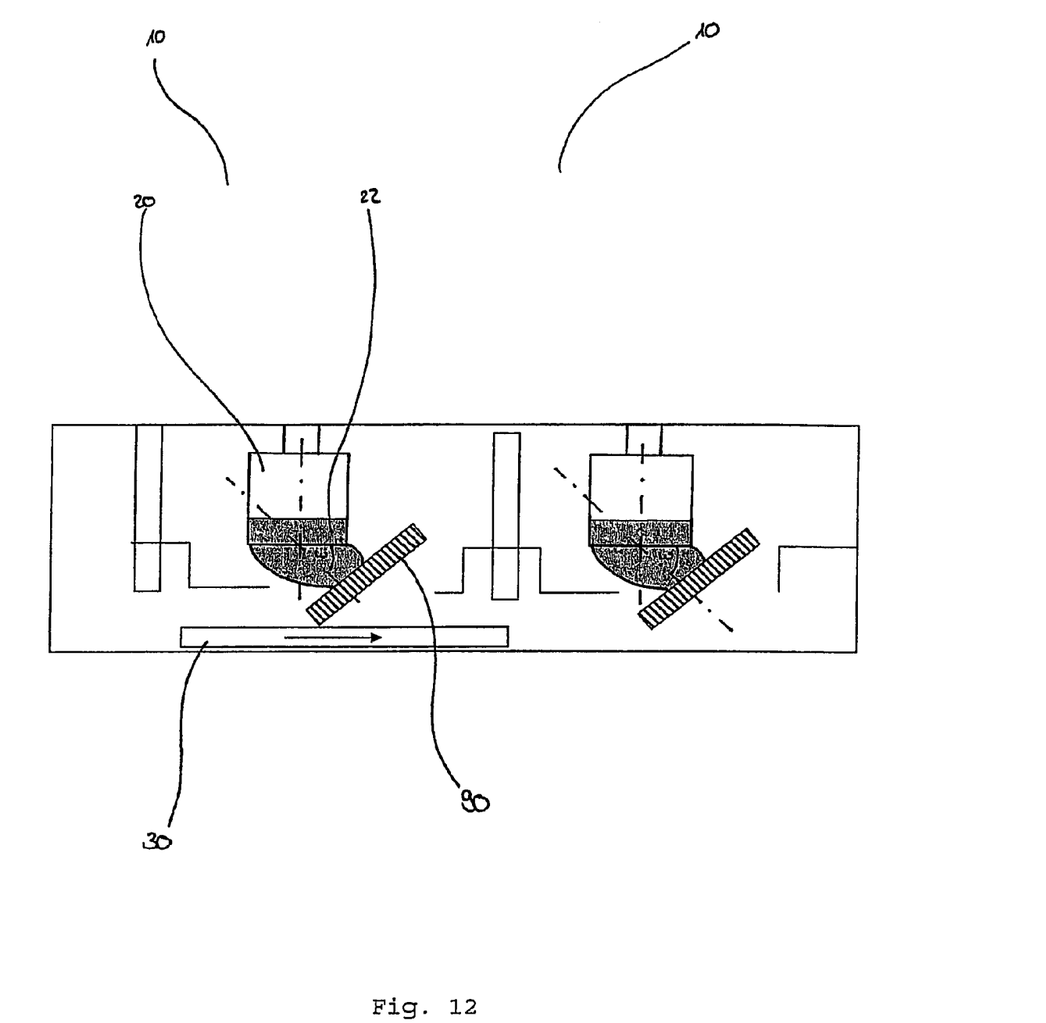

FIGS. 11 and 12 show further embodiments in which the cathodes are positioned at any desired angle relative to the substrate and the sputter plasma with the sputter jets are at an angle relative to the cathode. In FIG. 11, the cathode 20, for example, is parallel to the surface of the substrate 30, while the sputter jets are deflected in such a way that they form a field that is slanted at the angle $\omega$. This slanted field is passed through the filter 90 and its sputter jets are applied onto the substrate likewise at an angle $\omega$.

Figure 13:
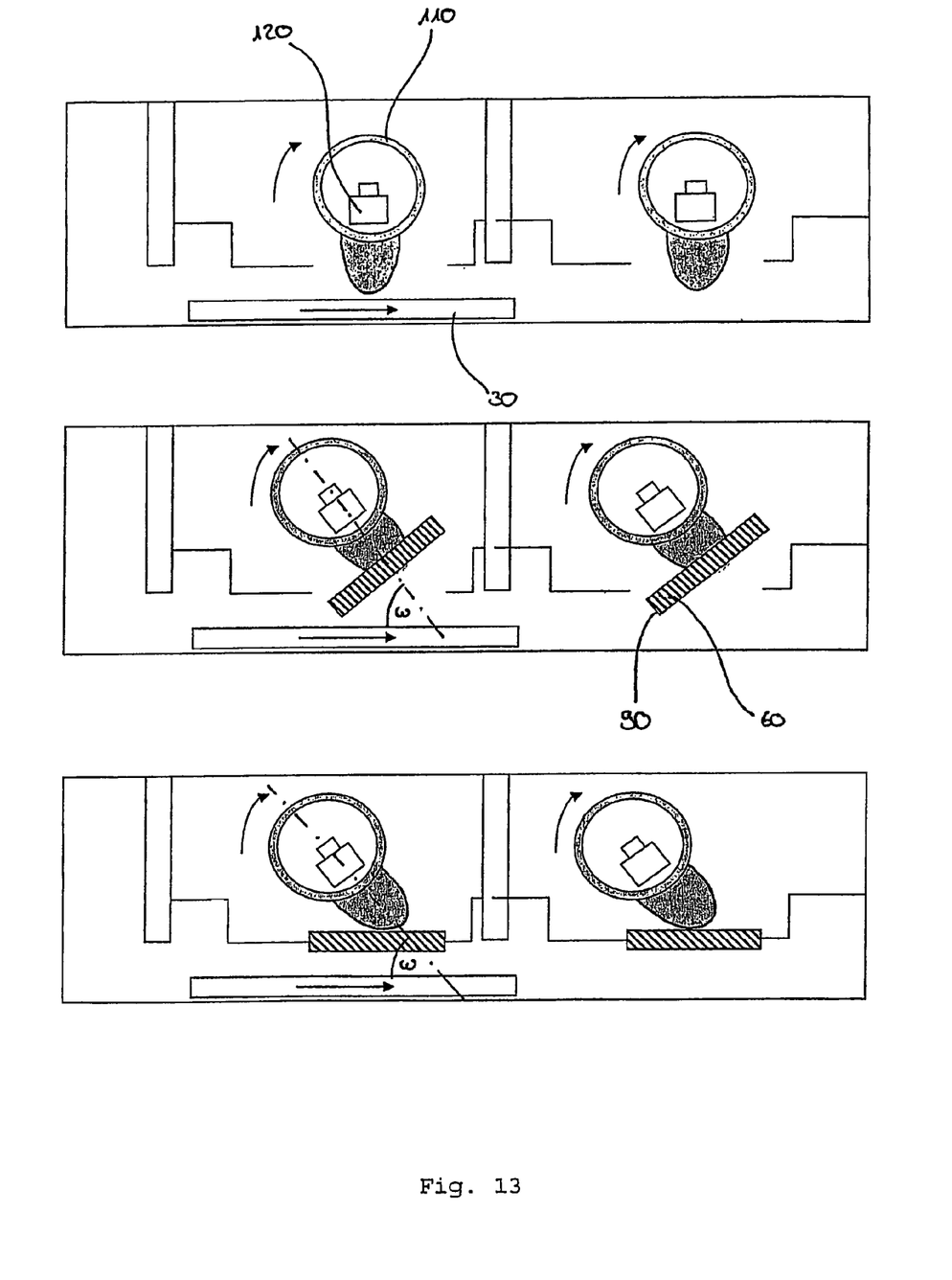

FIG. 13 shows another embodiment in which rotating cathodes with tubular target material 110 are used. This target tube contains magnets 120 and a water cooling system. Due to the rotation of the target, the target material is removed uniformly. When the magnets are turned, as shown in the drawing, the plasma also turns and the sputter particles are deposited at an angle $\omega$ relative to the substrate 30. The position of the filter 90 with the individual filter structures 60 can, once again, be selected as desired.

The deflection of the sputtered particles by collisions depends on the free path length of the sputter particles and thus on the sputter pressure in the chamber 100. The sputter pressure likewise has an influence on the sputter rate so that an optimum has to be found for the application in question.

The incorporation according to the invention of a filter structure is not limited to the method of sputtering in a PVD system but rather can also be used with other methods in which a targeted application of deposition material onto a substrate is to be performed. Other possible application forms are, for example, closed space sublimation, thermal vaporization as well as spraying.

LIST OF REFERENCE NUMERALS

10 PVD system
20 sputtering cathode
21 anode
22 sputter target
30 substrate
40 point source of a sputter target
50 aperture
60 individual structure of a filter
90 multiple structure of a filter
100 chamber of a PVD system
110 target material of a rotating cathode
120 magnet

The invention claimed is:

1. A method for the targeted application of deposition material onto a substrate in a PVD system, in which the particle jets sputtered off by a sputter target (22) of a sputtering cathode (20) pass through a filter (90) with several channel-like individual structures (60) onto the substrate (30), as a result of which the sputter particle flux is limited to a narrow angular range, and the particle jets are applied onto the substrate at an angle different from 90°, whereby the angle remains constant during the application process, characterized in that the particle jets pass through channel-like individual structures (60) of the filter (90) that are at an angle different from 90° relative to the substrate, whereby the sputtering cathode (20) deposits the material jets at the same angle relative to the surface of the substrate; and that the particle jets are applied inside a device in a first station at an angle $\gamma$ and in a second station at an angle $\phi$, whereby the angles of incidence differ from each other.

2. A device for the targeted application of deposition material at an angle onto a substrate in a PVD system, in which a filter (90) with several channel-like individual structures (60) is positioned between at least one sputtering cathode (20) with a sputter target (22) and the substrate (30), and the device has means with which the deposition material can be applied at an angle that remains constant relative to the surface of the substrate during the application process, whereby the angle is different from 90°, characterized in that the channel-like individual structures (60) of the filter (90) are arranged in such a way that they are at an angle different from 90° relative to the substrate and the sputtering cathode (20) is configured in such a way that it deposits material jets at the same angle relative to the surface of the substrate; and that the device has means for applying deposition material at an angle $\gamma$ in a first station and for applying deposition material at an angle $\phi$ in a second station, whereby the angles of incidence differ from each other.

3. The method according to claim 1, characterized in that the sputtering cathode (20) with the sputter target (22) as well as the filter (90) are positioned at an angle $\gamma$ relative to the surface of the substrate (30).

4. The device according to claim 2, characterized in that the sputtering cathode (20) with the sputter target (22) as well as the filter (90) are positioned at an angle $\gamma$ relative to the surface of the substrate (30).

5. The method according to claim 1, characterized in that the sputtering cathode (20) with the sputter target (22) is positioned at an angle $\gamma$ relative to the surface of the substrate (30) while the filter (90) runs parallel to the surface of the substrate (30) and the channel-like individual structures (60) of the filter run at an angle $\gamma$ relative to the substrate (30).

6. The device according to claim 2, characterized in that the sputtering cathode (20) with the sputter target (22) is positioned at an angle $\gamma$ relative to the surface of the substrate (30) while the filter (90) runs parallel to the surface of the substrate (30) and the channel-like individual structures (60) of the filter run at an angle $\gamma$ relative to the substrate (30).

7. The method according to claim 1, characterized in that the sputtering cathode (20) with the sputter target (22) is positioned at an angle $\gamma$ relative to the surface of the substrate (30), the filter (90) runs at another angle relative to the surface of the substrate, and the channel-like individual structures (60) of the filter once again run at an angle $\gamma$ relative to the substrate (30).

8. The device according to claim 2, characterized in that the sputtering cathode (20) with the sputter target (22) is positioned at an angle $\gamma$ relative to the surface of the substrate (30), the filter (90) runs at another angle relative to the surface of the substrate, and the channel-like individual structures (60) of the filter once again run at an angle $\gamma$ relative to the substrate (30).

9. The method according to claim 1, characterized in that the particle jets sputtered off by the cathode (20) are deposited at an angle $\omega$ relative to the cathode, the filter (90) is positioned parallel or at an angle to the surface of the substrate and the individual structures (60) of the filter once again run at an angle $\omega$ relative to the surface of the substrate.

10. The device according to claim 2, characterized in that the particle jets sputtered off by the cathode (20) are deposited at an angle $\omega$ relative to the cathode, the filter (90) is positioned parallel or at an angle to the surface of the substrate and the individual structures (60) of the filter once again run at an angle $\omega$ relative to the surface of the substrate.

11. The method according to claim 1, characterized in that the sputtering cathode is a rotating cathode.

12. The device according to claim 2, characterized in that the sputtering cathode is a rotating cathode.

13. The method according to claim 11, characterized in that magnets (120) of the rotating cathode are set in such a way that the sputter particle jets are deposited at an angle $\omega$ relative to the surface of the substrate.

14. The device according to claim 12, characterized in that magnets (120) of the rotating cathode are set in such a way that the sputter particle jets are deposited at an angle $\omega$ relative to the surface of the substrate.

15. The method according to claim 1, characterized in that the filter (90) consists of several channel-like individual structures (60) with a square cross section.

16. The device according to claim 2, characterized in that the filter (90) consists of several channel-like individual structures (60) with a square cross section.

17. The method according to claim 1, characterized in that the filter (90) consists of several channel-like individual structures (60) with a rectangular cross section.

18. The device according to claim 2, characterized in that the filter (90) consists of several channel-like individual structures (60) with a rectangular cross section.

19. The method according to claim 17, characterized in that the width W of the channel-like individual structures (60) of the filter (90) is about 2 mm to 25 mm.

20. The device according to claim 18, characterized in that the width W of the channel-like individual structures (60) of the filter (90) is about 2 mm to 25 mm.

21. The method according to claim 1, characterized in that the filter (90) consists of several channel-like individual structures (60) with a round cross section.

22. The device according to claim 2, characterized in that the filter (90) consists of several channel-like individual structures (60) with a round cross section.

23. The method according to claim 21, characterized in that the width of the channel-like individual structures (60) is defined by the diameter and is about 2 mm to 25 mm.

24. The device according to claim 22, characterized in that the width of the channel-like individual structures (60) is defined by the diameter and is about 2 mm to 25 mm.

25. The method according to claim 1, characterized in that the filter (90) consists of several channel-like individual structures (60) with a honey-comb cross section.

26. The device according to claim 2, characterized in that the filter (90) consists of several channel-like individual structures (60) with a honeycomb cross section.

27. The method according to claim 1, characterized in that the width of the channel-like individual structures (60) is defined by the widest cross section and is about 2 mm to 25 mm.

28. The device according to claim 2, characterized in that the width of the channel-like individual structures (60) is defined by the widest cross section and is about 2 mm to 25 mm.

29. The method according to claim 1, characterized in that the filter (90) consists of several channel-like individual structures (60) with various cross sections.

30. The device according to claim 2, characterized in that the filter (90) consists of several channel-like individual structures (60) with various cross sections.

31. The method according to claim 1, characterized in that at least 80% of the filter (90) consists of plastics, aluminum alloys, iron and/or steel alloys.

32. The device according to claim 2, characterized in that at least 80% of the filter (90) consists of plastics, aluminum alloys, iron and/or steel alloys.

33. The method according to claim 1, characterized in that the angle of aperture $\beta$ of the individual structures (60) can be calculated from the relationships $\beta=2\times\alpha$ and $\tan \alpha=W/L$.

34. The device according to claim 2, characterized in that the angle of aperture $\beta$ of the individual structures (60) can be calculated from the relationships $\beta=2\times\alpha$ and $\tan \alpha=W/L$.

35. The method according to claim 1, characterized in that the angle of aperture $\beta$ is about 10° to 120°.

36. The device according to claim 2, characterized in that the angle of aperture $\beta$ is about 10° to 120°.

37. The method according to claim 1, characterized in that the length L of the channel-like individual structures (60) of the filter (90), depending on the desired angle of aperture, can be calculated according to the relationships $\tan \alpha=W/L$ and $\beta=2\times\alpha$.

38. The device according to claim 2, characterized in that the length L of the channel-like individual structures (60) of the filter (90), depending on the desired angle of aperture, can be calculated according to the relationships $\tan \alpha=W/L$ and $\beta=2\times\alpha$.

39. The method according to claim 1, characterized in that the number of channel-like individual structures (60) of the filter (90) is about $1600/m^2$ to $250,000/m^2$.

40. The device according to claim 2, characterized in that the number of channel-like individual structures (60) of the filter (90) is about $1600/m^2$ to $250,000/m^2$.

41. The method according to claim 1, characterized in that the deposition rate of the device is about 0.1 nm/min to 1000 nm/min.

42. The device according to claim 2, characterized in that the deposition rate of the device is about 0.1 nm/min to 1000 nm/min.

* * * * *